United States Patent [19]
Aronowitz et al.

[11] Patent Number: 5,904,551
[45] Date of Patent: May 18, 1999

[54] PROCESS FOR LOW ENERGY IMPLANTATION OF SEMICONDUCTOR SUBSTRATE USING CHANNELING TO FORM RETROGRADE WELLS

[75] Inventors: Sheldon Aronowitz; James Kimball, both of San Jose, Calif.

[73] Assignee: LSI Logic Corporation, Milpitas, Calif.

[21] Appl. No.: 08/631,360

[22] Filed: Apr. 12, 1996

[51] Int. Cl.$^6$ .......................... H01L 21/265; H01L 21/70
[52] U.S. Cl. .......................... 438/514; 438/515; 438/526; 438/529
[58] Field of Search ..................................... 438/514, 515, 438/526, 529, FOR 160, FOR 154

[56] References Cited

U.S. PATENT DOCUMENTS

| | | | |
|---|---|---|---|
| 4,710,477 | 12/1987 | Chen | 437/34 |
| 5,393,689 | 2/1995 | Pfiester et al. | 437/52 |

OTHER PUBLICATIONS

Wolf & Tauber, "Silicon Processing for the VLSI Era" vol. 1 (Lattice Press, Ca(1986) pp. 292–301.
Takatsuka et al., Proc. IEEE Mar. 1995, Int'l Conference on Microelectronic Test Structures, vol. 8 pp. 247–251.

*Primary Examiner*—Cecilia J. Tsang
*Assistant Examiner*—Bennet Celsa
*Attorney, Agent, or Firm*—John P. Taylor

[57] ABSTRACT

A process is disclosed for forming one or more doped regions beneath the surface of a single crystal semiconductor substrate, such as retrograde wells or deeper source/drain regions, by implantation at low energy which comprises orienting the crystal lattice of the semiconductor substrate, with respect to the axis of the implantation beam, i.e., the path of the energized atoms in the implantation beam, to maximize the number of implanted atoms which pass between the atoms in the crystal lattice. This results in the peak concentration of implanted atoms in the crystal lattice of the single crystal semiconductor substrate being deeper than the peak concentration of implanted atoms in the substrate would be if the axis of the implantation beam were not so oriented with respect to the crystal lattice of the semiconductor substrate during implantation.

12 Claims, 4 Drawing Sheets

PROCESS FOR LOW ENERGY IMPLANTATION OF SEMICONDUCTOR SUBSTRATE USING CHANNELING TO FORM RETROGRADE WELLS

BACKGROUND OF THE INVENTION

1. Field of the Invention

This invention relates to a process for forming doped regions beneath the surface of semiconductor substrates for the construction of integrated circuit structures therein. More particularly, this invention relates to a process for implantation of one or more dopants into a semiconductor substrate, using channeling to permit deeper implantation into the substrate, to thereby permit the formation of retrograde wells without the use of high energy during the implantation.

2. Description of the Related Art

Implantation of a dopant into a semiconductor substrate using a beam of charged atomic species is a well known method of introducing a dopant into a semiconductor lattice, for example, to change the semiconductor characteristics of the particular semiconductor material. Atoms of the dopant material are injected into the semiconductor lattice at a preselected energy level which generally controls the degree (depth) of penetration of the dopant into the semiconductor lattice. Subsequent to the implantation step, an anneal is carried out to repair damage to the crystal lattice caused during the penetration of the implanted atoms into the single crystal lattice of the semiconductor by the implantation.

Conventionally the depth of the implantation of the dopant into the semiconductor substrate is usually limited for a number of reasons, including the avoidance of further potential damage to the crystal lattice of the semiconductor substrate, the cost and availability of high energy implantation equipment, and the construction of integrated circuit structure close to the surface of the substrate, as well as other reasons.

Because of this desire to avoid deep implantations, the orientation of the crystal lattice of the semiconductor substrate is usually controlled, with respect to the axis of the implantation beam, to avoid having the implanted high energy atoms enter the crystal lattice at an angle which would permit the implanted atoms to pass between the atoms in the crystal lattice, rather than strike the atoms comprising the crystal lattice. Such a phenomena, known as "channeling", causes the high energy atoms to penetrate deeper into the semiconductor lattice since many of the implanted atoms do not encounter and impact the crystal lattice atoms, but rather pass between them.

FIG. 1 shows a prior art implantation setup wherein a silicon substrate 2, i.e., a silicon semiconductor wafer, has been tilted on axis 10 so that the cubic single crystal lattice of substrate 2 comprising silicon atoms 4 is not aligned with the paths of the dopant atoms 6 being implanted, i.e., so that implanted dopant atoms 6 are inhibited from passing down the paths or channels between the stacked silicon atoms in the cubic crystal lattice. By tilting the entire substrate 2, the dopant atoms 6 being implanted into the single crystal substrate 2 are more likely to strike the silicon atoms 4 in the crystal lattice of silicon substrate 2, in which case the dopant atoms 6 will not penetrate as deeply into substrate 2 as if they passed or "channeled" between silicon atoms 4 in substrate 2.

In certain circumstances, however, the use of a deeper implantation may be desirable, for example, for retrograde well formation to reduce latchup; or for forming deeper source/drain regions, under the same annealing conditions, to provide enhanced electrostatic discharge protection.

Formation of such a retrograde well, i.e., a well below the surface of the semiconductor substrate, or the formation of deeper source/drain regions, is conventionally carried out by increasing the implant energy for the particular dopant being implanted into the semiconductor substrate. However, such increased energy levels may necessitate the use of larger (higher energy) implantation apparatus, result in further damage to the semiconductor substrate being implanted, increase the lateral straddle of the implanted region (resulting in encroachment on adjacent doped regions of differing conductivity type or level), and result in gate penetration. It would, therefore, be desirable to be able to form doped regions beneath the substrate surface, such as retrograde doped conductivity wells in semiconductor substrates, by implantation without the need to increase the implant energy level of the implanted atoms.

SUMMARY OF THE INVENTION

The invention comprises a process for forming doped regions beneath the surface of semiconductor substrates, such as retrograde wells, by implantation using low energy which comprises orienting the crystal structure of the semiconductor substrate, with respect to the path of the atoms in the implantation beam, to permit the implanted atoms to pass between the atoms in the crystal lattice (to channel) so that the implanted atoms penetrate deeper into the crystal lattice of the semiconductor substrate than would implanted atoms not so oriented with respect to the single crystal lattice of the substrate.

DETAILED DESCRIPTION OF THE INVENTION

The invention comprises a process for forming doped regions, such as retrograde wells or deep source/drain regions, in semiconductor substrates by implantation using low energy which comprises orienting the crystal lattice of the semiconductor substrate, with respect to the axis of travel of the atoms in the implantation beam, to permit the atoms in the implantation beam to pass between the atoms in the crystal lattice (channel) so that the implanted atoms penetrate deeper into the crystal lattice of the semiconductor substrate than would implanted atoms not so oriented with respect to the crystal lattice of the substrate.

The crystal lattice of the semiconductor substrate may be oriented, with respect to the axis of travel of the atoms in the implantation beam, by adjusting the tilt and the twist of the semiconductor substrate with respect to the beam of atoms being implanted.

By use of the term "low energy" herein is meant an energy which is lower than the energy required to implant the same atom to the same depth in the same single crystal substrate without channeling. By use of the term "retrograde well" herein is meant a doped region in a semiconductor substrate wherein the peak concentration of the dopant is below the electrically active region of any device which will be formed in the well. By use herein of the term "deep source/drain regions" is meant a source or drain region which is deeper than a conventional source/drain region, but less than the depth of the well in which the source/drain region is located. Such a deep source/drain region enlarges the area for electrostatic discharge, thereby mitigating deleterious heat buildup in the substrate. For example, where a conventional source/drain region may be formed to a depth of about 2000 Å (in a well of 0.5 µm–1µm depth), the practice of the invention may permit formation of a source/drain region 25–50% deeper(2500 Å–3000 Å) without the use of any higher implantation energy and under the same anneal conditions.

By use of the term "tilt" herein is meant rotation of the substrate around an axis (the tilt axis) lying in the plane of the semiconductor substrate and perpendicular to the beam axis. When the semiconductor substrate is a semiconductor wafer, the tilt axis is disposed parallel to the flat located on one side of the wafer. By use of the word "twist" herein is meant rotation of a semiconductor substrate in the plane of the substrate with the twist axis therefore perpendicular to the tilt axis.

Figure 1:
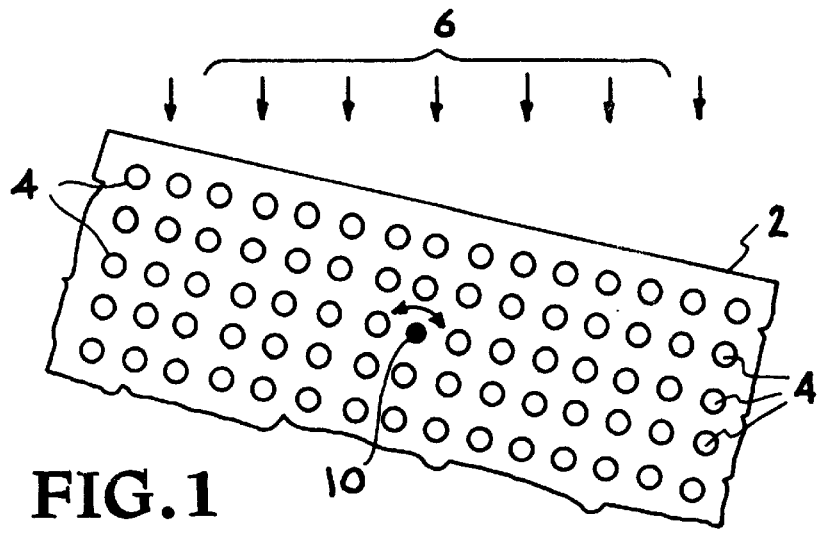
FIG. 1 is a fragmentary side section view of a single crystal silicon substrate oriented into a prior art tilted position during a dopant implant step to inhibit channeling of the atoms being implanted into the substrate.

As previously described, with respect to FIG. 1, it is conventional to orient the crystal lattice of a single crystal substrate, such as a silicon semiconductor wafer, so that a beam of energized atoms being implanted into the crystal lattice will not pass or channel between the atoms in the crystal lattice to penetrate deeply into the lattice, but rather to optimize the striking or bombardment of the lattice atoms by the implanted atoms to thereby control and limit the depth of penetration of the implanted atoms. This not only minimizes the amount of damage done to the crystal lattice by the implanted atoms, but also increases the concentration of the implanted atoms (dopant) adjacent the surface of the crystal lattice which is usually where one desires to locate the doped region.

Figure 2:
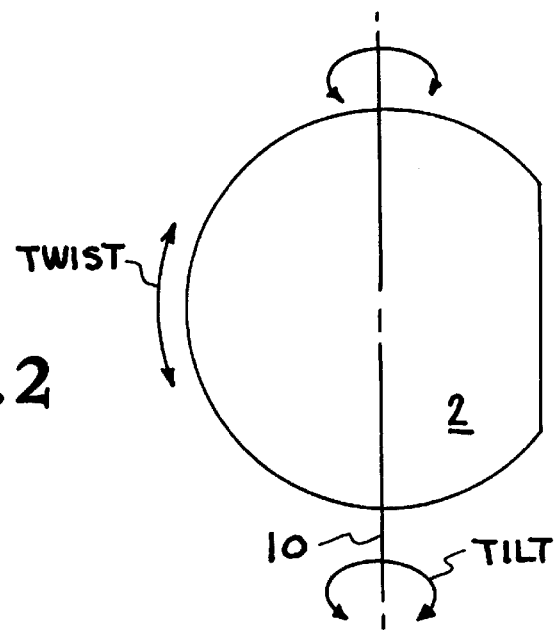
FIG. 2 is a top view illustrating how a single crystal semiconductor substrate may be either tilted or twisted to change the orientation of the crystal lattice of the substrate relative to a beam of high energy atoms entering the crystal lattice from an implanter.

This is conventionally carried out by tilting and twisting the axes of the crystal lattice, as illustrated in both FIGS. 1 and 2. For a silicon substrate having a cubic crystal structure, and with a <100> face, it is conventional, when using an Eaton 6200 implanter, available from the Eaton Corporation, to provide a 7° tilt angle and a 23° twist angle. These angles have been empirically determined in the past to provide a minimum of channeling of the beam of implanted atoms.

In accordance with the invention, however, the single crystal semiconductor lattice is reoriented, by adjusting either the tilt angle alone or a combination of both the tilt and twist angles, so that channeling of the implanted atoms in the single crystal lattice is maximized, to thereby increase the penetration depth of the implanted atoms without the need to increase the implantation energy imparted to the atoms in the beam to be implanted.

Figure 3:
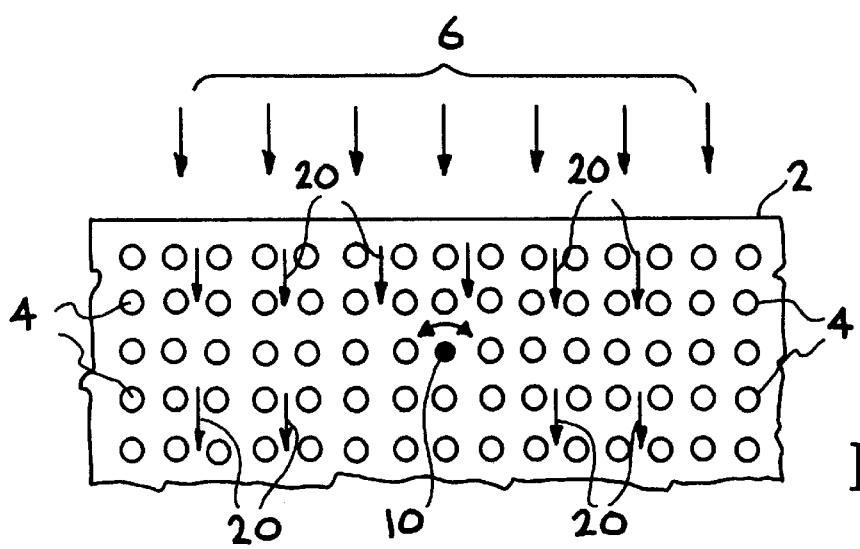
FIG. 3 is a fragmentary side section view of a silicon substrate oriented, in accordance with the invention, into a position during a dopant implant step which will maximize channeling of the atoms being implanted into the substrate to permit deeper penetration of the implanted atoms into the substrate.

This is shown in FIG. 3 wherein by providing a tilt angle of 0° and a twist angle of 0° to the substrate, a silicon single crystal substrate, having a <100> face thereon perpendicular to the path of the beam of energized atoms to be implanted, channeling of the implanted atoms between the silicon atoms in the lattice will be maximized, as shown by arrows 20 in FIG. 3. It should, however, be noted in this regard that this illustrated orientation of single crystal silicon to achieve maximizing of the channeling of the implanted atoms is based on the <100> face orientation of certain single crystal silicon wafers. Single crystal silicon wafers are also available with a <111> face orientation, in which case the lattice would have to be reoriented, by readjusting the previously described tilt angle and twist angle, to again maximize the channeling between the silicon atoms in the lattice of the atoms in the implantation beam to achieve the desired deep penetration of the dopant atoms into the single crystal lattice.

While the invention is illustrated with respect to single crystal silicon, a Group IV semiconductor having a cubic crystal form, it will be appreciated that the invention may also be used with other semiconductor materials, including other Group IV semiconductors such as germanium; Group III–V semiconductors such as, for example, GaAs and InAs; and Group II–VI semiconductors such as, for example, CdS, CdSe, ZnS, or ZnSe.

It should also be noted that the type of crystal structure, e.g., cubic, orthorhombic, tetragonal, monoclinic, triclic, etc., will also have an effect on which way the single crystal lattice must be reoriented, with respect to the axis of the beam of atoms from the implanter, to achieve the desired maximum penetration of the implanted dopant atoms. Determination of the optimum orientation of the crystal lattice to achieve maximum channeling of the implanted atoms through the single crystal structure may, however, be done empirically regardless of the crystal type, with the results (concentration of dopant versus depth) later measured by one or more methods, including, for example, secondary ion mass spectrometry (SIMS), or (when testing for active dopant versus depth) using spreading resistance profiling (SRP).

To further illustrate the invention, a series of single crystal silicon wafers, each having a <100> face orientation, was implanted with either boron or phosphorus to respectively form either a retrograde P-well or a retrograde N-well. In each instance the silicon wafer, after implantation, was annealed at 900° C. for 30 minutes in a nitrogen atmosphere. In each instance, the concentration of the dopant versus depth into the substrate was measured using spreading resistance profiling (SRP) and then plotted to show the peak concentration.

Figure 4:
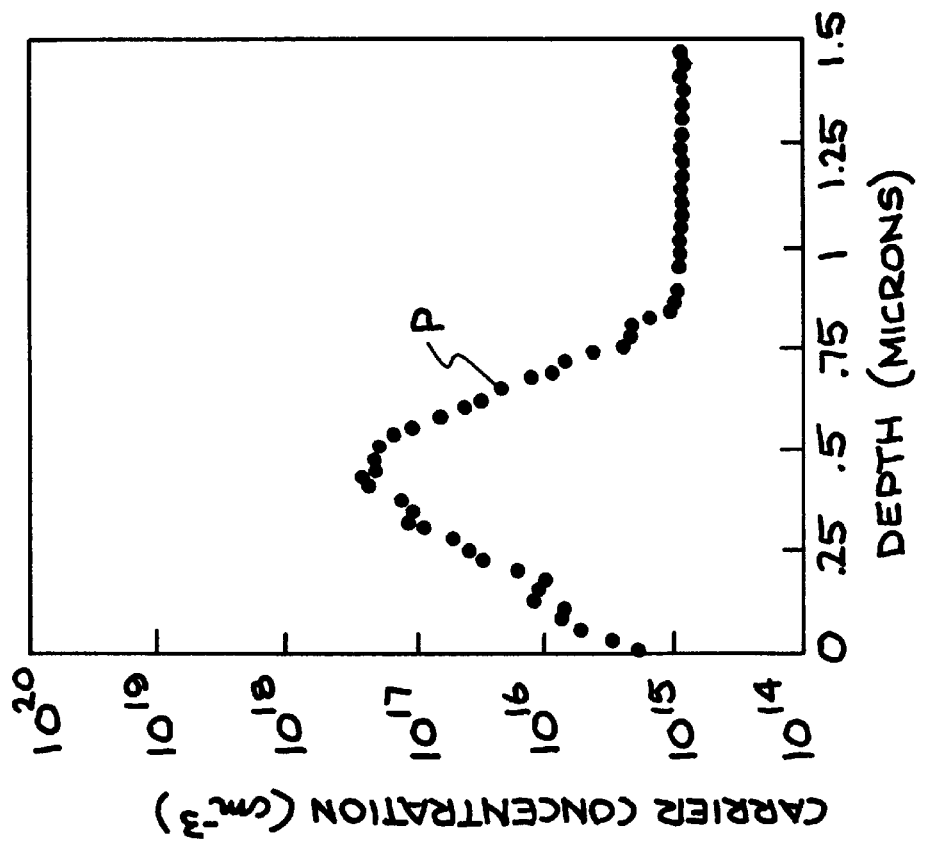
FIG. 4 is a graph showing the active dopant concentration plotted against substrate depth for a prior art boron implantation into a single crystal P-type doped silicon substrate to form a P-well without optimizing the orientation of the crystal lattice of the silicon substrate with respect to the direction of travel of the implanted boron atoms. (no channeling)

FIG. 4 represents the results for a prior art boron implantation into a single crystal silicon wafer at an energy level of 180 keV and a dopant concentration of $6.8 \times 10^{12}$ B/cm$^2$ to form a P-well. In this instance, the silicon wafer was oriented on an Eaton 6200 implanter with a 7° tilt angle and a 23° twist angle, representative of the conventional prior art orientation of a <100> face silicon wafer to an implantation beam to minimize channeling of the dopant atoms. It will be noted from the graph in FIG. 4 that the peak concentration of dopant atoms is at about 0.4 microns depth.

Figure 5:
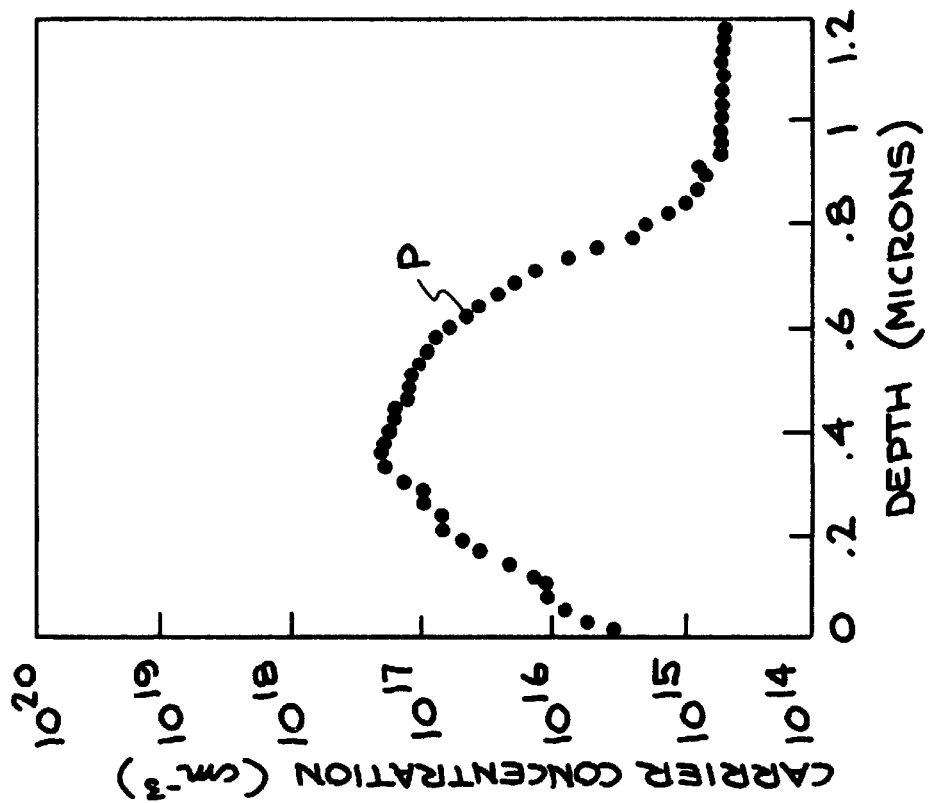
FIG. 5 is a graph showing the active dopant concentration plotted against substrate depth for a boron implantation into a single crystal P-type doped silicon substrate to form a P-well with the crystal lattice of the silicon substrate oriented to optimize channeling of the implanted boron atoms between the silicon atoms in the single crystal lattice of the substrate.

FIG. 5 represents the results of an orientation using 0° tilt and 0° twist angles, i.e., equivalent to a perpendicular implantation against the <100> face of the single crystal silicon wafer, using the same concentration of boron dopant as in the results shown in FIG. 4, but at an energy level of 100 keV instead of 180 keV. It will be noted that the plotted results shown in FIG. 5 are very similar to those shown in FIG. 4, even though the energy used is only about 55% of that used for implanting the previous wafer because of the optimization of the orientation of the silicon lattice to promote channeling, in accordance with the invention.

Figure 6:
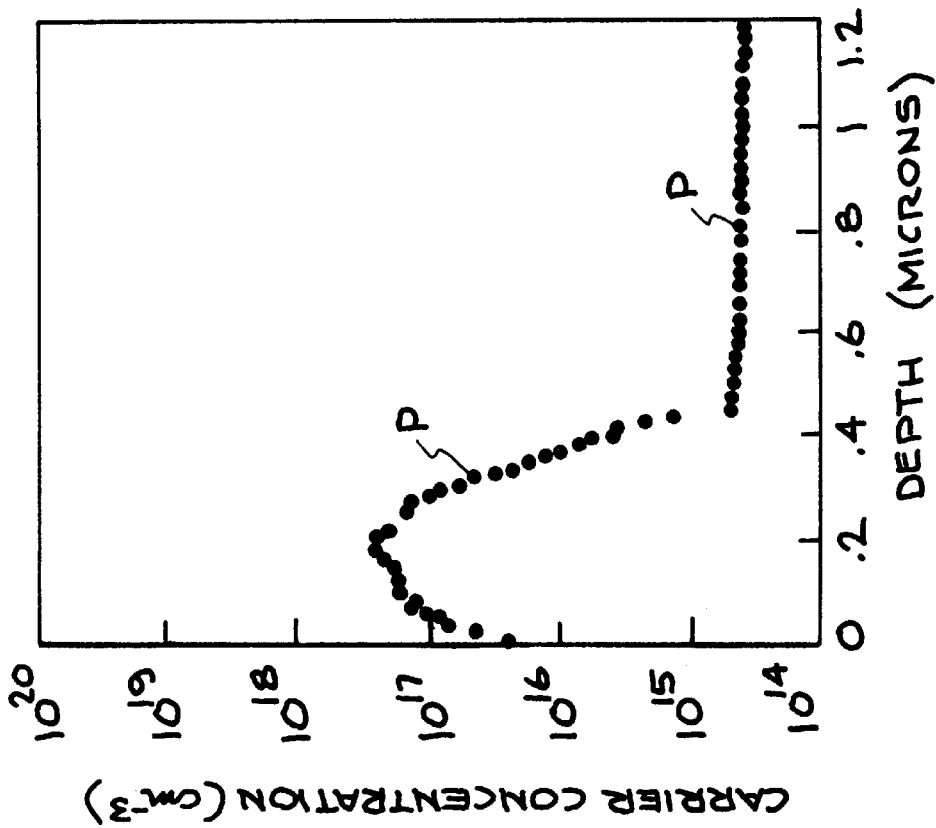
FIG. 6 is a graph showing the active dopant concentration plotted against substrate depth for a boron implantation into a single crystal P-type doped silicon substrate to form a P-well with the crystal lattice of the silicon substrate oriented in a manner which does not optimize the channeling of the implanted boron atoms between the silicon atoms in the single crystal lattice of the substrate.

The results shown in FIG. 6 are presented to provide a contrast to the results of FIG. 5 to show the difference in penetration depth when channeling is not maximized. In the results shown for FIG. 6, the same implant energy (100 keV) was used as in FIG. 5. It will be seen that in the graph of FIG. 6, the peak concentration and also the tailing off of the concentration are at a much shallower depth than the results shown in FIG. 5, indicative that the same degree of channeling did not occur in FIG. 6 as in the implantation shown in FIG. 5.

Thus, for a single crystal silicon lattice, to promote channeling to achieve an equivalent depth of dopant penetration at 100 keV to a conventional implant at an energy level of 180 keV, i.e., to optimize channeling, the silicon crystal lattice must be oriented to provide the <100> face of the crystal perpendicular to the axis of the implantation beam.

Figure 7:
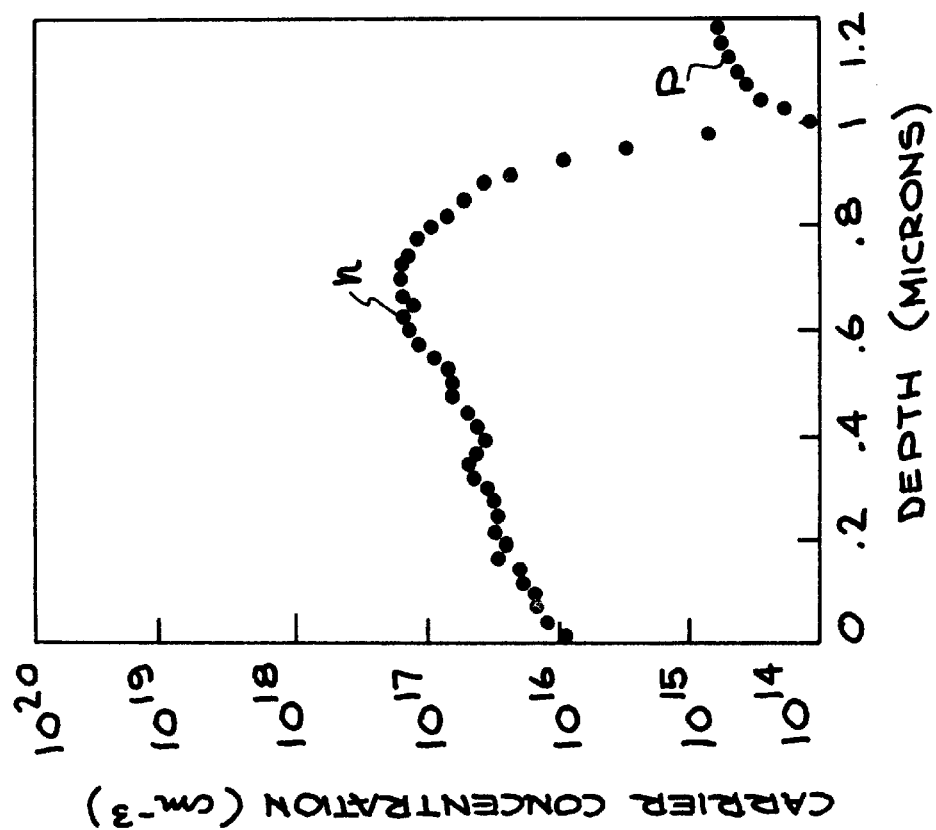
FIG. 7 is a graph showing the net active dopant concentration plotted against substrate depth for a prior art boron ,and phosphorus implantation into a single crystal P-type doped silicon substrate to form an N-well without optimizing the orientation of the crystal lattice of the silicon substrate with respect to the direction of travel of the implanted boron and phosphorus atoms. (no channeling)
Figure 8:
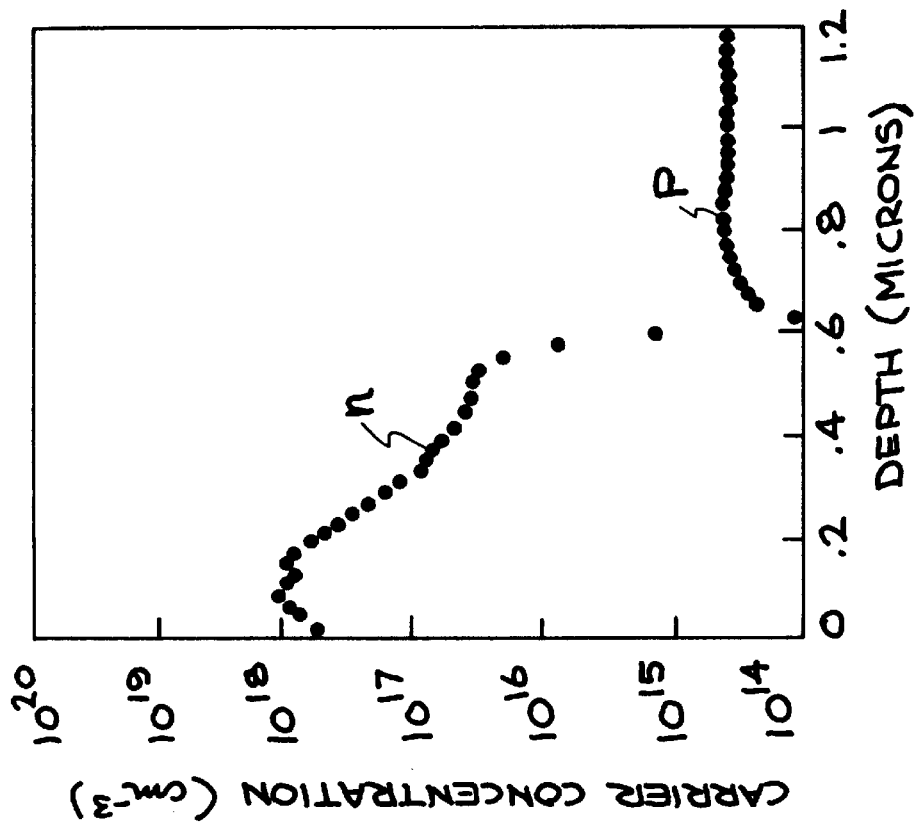
FIG. 8 is a graph showing the net active dopant concentration plotted against substrate depth for a phosphorus implantation into a single crystal P-type doped silicon substrate to form an N-well with the crystal lattice of the silicon substrate oriented to optimize channeling of the implanted phosphorus atoms between the silicon atoms in the single crystal lattice of the substrate.
Figure 9:
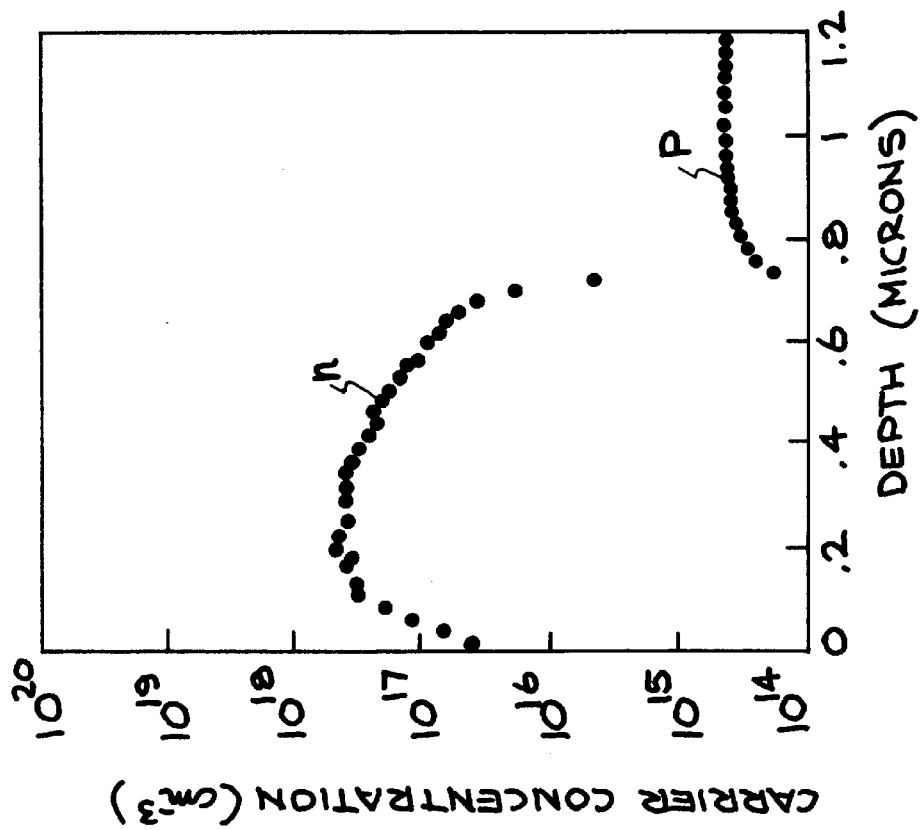
FIG. 9 is a graph showing the net active dopant concentration plotted against substrate depth for a phosphorus implantation into a single crystal P-type doped silicon substrate to form an N-well with the crystal lattice of the silicon substrate also oriented in a manner which does not optimize channeling of the implanted phosphorus atoms between the silicon atoms in the single crystal lattice of the substrate.

This was also illustrated for phosphorus doping of single crystal silicon substrates to form retrograde wells as shown respectively in FIGS. 7–9. FIG. 7 shows the results when a conventional implantation of silicon to form a retrograde N-well was carried out wherein phosphorus is first implanted at an energy level of 450 keV and a dopant concentration of $1.5 \times 10^{13}$ P/cm$^2$, followed by implantation with boron at the same concentration and energy level used for the P-well ($6.8 \times 10^{12}$ B/cm$^2$ and 180 keV) followed by the previously described anneal, to form an N-well. As in the example illustrated in FIG. 4, the silicon wafer was again conventionally oriented with a 7° tilt angle and a 23° twist angle, representative of the conventional prior art orientation of a <100> face silicon substrate to minimize channeling of the dopant atoms. The peak concentration of phosphorus in the retrograde N-well is shown in FIG. 7 to occur at a depth of about 0.7 micrometers.

To illustrate the optimization of channeling for phosphorus doping, in accordance with the invention, another silicon wafer was implanted with the same dosage of phosphorus, but at an energy level of only 100 keV, and with the wafer oriented with 0° tilt and 0° twist angles, i.e., equivalent to a perpendicular implantation against the <100> face of the silicon wafer to optimize channeling of the implanted phosphorus atoms between the silicon atoms in the single crystal lattice of the substrate. As shown in FIG. 8, the peak concentration of the phosphorus dopant was at 0.2 micrometers, even though the energy level of the implanted phosphorus atoms was less than 25% that of the implant energy used in the example shown in FIG. 7. It should be noted, in this regard, that the depth of the implantation could have been increased, e.g., to match the 0.7 micrometer depth of FIG. 7, by increasing the energy while still staying well below the 450 keV energy needed to form the well of FIG. 7.

FIG. 9 represent results similar to those presented in FIG. 6, i.e., when the crystal lattice is not oriented to maximize channeling. In FIG. 9, a tilt angle of 45° and a twist angle of 45° were utilized (equivalent to an implant perpendicular to a <111> face). In the implantation represented by the graph of FIG. 9, a beam energy of 100 keV was used, as in FIG. 8. It will be seen that in FIG. 9, the peak concentration of phosphorus was at a much shallower depth, indicative that the same degree of channeling did not occur as in the phosphorus implantation shown in FIG. 8, due to the failure to optimize orientation of the substrate to promote channeling.

Thus, the invention provides an improved method for forming doped regions such as retrograde wells beneath the surface of semiconductor substrates, using channeling to achieve a deeper implantation (relative to surface implantations) without the customary use of higher energy to achieve such deep penetration.

Having thus described the invention what is claimed is:

1. A process for forming by low energy implantation of a single crystal semiconductor substrate a retrograde doped region having a peak dopant concentration spaced from the surface of said substrate without using an implantation energy greater than that used to form a doped region in said substrate having a peak dopant concentration adjacent the surface of said substrate which comprises:

a) first orienting the crystal lattice of said semiconductor substrate, with respect to the axis of the implantation beam, to maximize the number of implanted atoms which will pass between the atoms in said crystal lattice; and b) then implanting said substrate with said implantation beam to form said retrograde region in said substrate by channeling said implanted atoms between said atoms in said crystal lattice in said substrate;

so that said implanted atoms penetrate deeper into said crystal lattice of said single crystal semiconductor substrate than would implanted atoms not so oriented with respect to said crystal lattice of said semiconductor substrate during implantation, whereby a retrograde implantation may be carried out without increasing the implantation energy.

2. The process of claim 1 wherein said single crystal semiconductor substrate is selected from the group consisting of Group IV semiconductors, Group III–V semiconductors, and Group II–VI semiconductors.

3. The process of claim 2 wherein said single crystal semiconductor substrate is silicon.

4. The process of claim 3 wherein said crystal lattice of said single crystal silicon substrate is oriented, with respect to said axis of said implantation beam, to provide the <100> face of said single crystal silicon substrate normal to said axis of said implantation beam.

5. The process of claim 1 wherein said step of first orienting said crystal lattice of said semiconductor substrate, with respect to the axis of said implantation beam, to maximize the number of implanted atoms which will pass between said atoms in said crystal lattice further comprises orienting said crystal lattice of said substrate by adjusting both the tilt and the twist of said substrate with respect to said implantation beam to maximize channeling of said implanted atoms in said crystal lattice to thereby maximize the number of implanted atoms which will pass between said atoms in said crystal lattice.

6. A process for forming by low energy implantation of a single crystal semiconductor substrate a retrograde doped well having a peak dopant concentration spaced from the surface of said substrate without using an implantation energy greater than that used to form a doped well in said substrate having a peak dopant concentration adjacent the surface of said substrate which comprises:

a) first orienting the crystal face of said semiconductor substrate, with respect to the axis of the implantation beam, to maximize the number of implanted atoms which will pass between the atoms in the crystal lattice; and b) then implanting said substrate with said implantation beam to form said retrograde well in said substrate by channeling said implanted atoms between said atoms in said crystal lattice in said substrate;

so that said implanted atoms penetrate deeper into the crystal lattice of the semiconductor substrate than would implanted atoms not so oriented with respect to the crystal lattice of the substrate, whereby a retrograde implantation to form a retrograde well may be carried out without increasing the implantation energy.

7. The process claim 6 wherein said single crystal semiconductor substrate is selected from the group consisting of Group IV semiconductors, Group III–V semiconductor, and Group II–VI semiconductors.

8. The process of claim 7 wherein said single crystal semiconductor substrate is selected from the group of semiconductors consisting of Si, Ge, GaAs, InAs, CdS, CdSe, ZnS, and ZnSe.

9. The process of claim 7 wherein said single crystal semiconductor substrate is silicon.

10. The process of claim 9 wherein said crystal lattice of said single crystal silicon substrate is oriented, with respect to said axis of said implantation beam, to provide the <100> face of said single crystal silicon substrate normal to said axis of said implantation beam.

11. A process for forming by low energy implantation of a single crystal silicon substrate one or more deep source/drain regions, each having a peak dopant concentration spaced from the surface of said substrate without using an implantation energy greater than that used to form a doped source/drain region in said substrate having a peak dopant concentration adjacent the surface of said substrate which comprises:

a) orienting the crystal face of said single crystal silicon substrate, with respect to the axis of the implantation beam, to maximize the number of implanted atoms which will pass between the atoms in the crystal lattice; and b) then implanting said substrate with said implantation beam to form said one or more deep source/drain regions in said substrate by channeling said implanted atoms between said atoms in said crystal lattice in said substrate;

so that for a given total implanted dose, the peak distribution of such implanted atoms in said crystal lattice of said single crystal silicon substrate will be deeper in said crystal lattice of said single crystal silicon substrate than would be the peak distribution of implanted atoms not so oriented with respect to said crystal lattice of said silicon substrate during implantation, whereby a retrograde implantation to form one or more deep source/drain regions may be carried out without increasing the implantation energy.

12. A process for forming by low energy implantation of a single crystal silicon substrate a retrograde doped N well having a peak dopant concentration of phosphorus spaced from the surface of said substrate without using an implantation energy -greater than that used to form a doped N well in said substrate having a peak dopant concentration of phosphorus atoms adjacent the surface of said substrate which comprises:

a) first orienting the crystal face of said semiconductor substrate, with respect to the axis of the implantation beam of phosphorus atoms, to a 0° tilt angle and a 0° twist angle to maximize the number of implanted atoms which will pass between the atoms in the single crystal silicon lattice; and b) then implanting said single crystal silicon substrate with said implantation beam of phosphorus atoms at an energy level of about 100 KeV to form said retrograde N well in said substrate having a peak concentration of phosphorus dopant about 0.4 microns below the surface of said silicon substrate by channeling said implanted phosphorus atoms between said atoms in said crystal lattice in said substrate;

whereby said implanted phosphorus atoms penetrate deeper into said crystal lattice of said single crystal silicon substrate than would implanted phosphorus atoms not so oriented with respect to said crystal lattice of said substrate, whereby a retrograde implantation to form said retrograde N well may be carried out without increasing the implantation energy.

* * * * *